United States Patent [19]
Nelson et al.

[11] Patent Number: 6,136,615
[45] Date of Patent: Oct. 24, 2000

[54] MIGRATION FROM CONTROL WAFER TO PRODUCT WAFER PARTICLE CHECKS

[75] Inventors: Lauri Monica Nelson, Orlando; Mario Pita, Winter Springs; Chester Lamar Harris, Orlando, all of Fla.

[73] Assignee: Lucent Technologies, Inc., Murray Hill, N.J.

[21] Appl. No.: 09/430,635

[22] Filed: Oct. 29, 1999

[51] Int. Cl.$^7$ ................................. H01L 21/00
[52] U.S. Cl. ............................................ 438/12
[58] Field of Search .................... 438/12, 7, 5, 13, 438/16, 14, 17–18; 364/468.17, 468.28; 356/237

[56] References Cited

U.S. PATENT DOCUMENTS 5,773,315   6/1998   Jarvis .
5,844,249  12/1998   Takano et al. ................. 250/559.34
5,886,909   3/1999   Milor et al. ......................... 364/578

Primary Examiner—Charles Bowers
Assistant Examiner—Craig Thompson
Attorney, Agent, or Firm—Schnader Harrison Segal & Lewis LLP

[57] ABSTRACT

A method is provided for performing in-line process checks in an integrated circuit fabrication process. The process checks are performed on actual product wafers, rather than control wafers. According to the method, production lots of product wafers are subjected to in-line testing. Selected wafers representing each chamber of the fabrication apparatus are tested for defects. Using the actual product wafers allows the detection of the quantity, size, type, composition, and even the cause of the defects. When defects are found, the fabrication process and apparatus are adjusted to avoid producing additional lots with undesirable defects.

8 Claims, 1 Drawing Sheet

MIGRATION FROM CONTROL WAFER TO PRODUCT WAFER PARTICLE CHECKS

BACKGROUND OF THE INVENTION

1. Field of the Invention

The invention relates to integrated circuit fabrication and more particularly to a method of performing in-line process checks on a product wafer.

2. Description of the Related Art

During production of integrated circuits, many circuits are formed on a single silicon wafer. Several wafers may be processed simultaneously in different chambers of the fabrication apparatus. The processed wafers contain integrated circuits that eventually become the final product, or chips. These wafers are often referred to as "product wafers." After wafer production, the chips are subjected to functional testing and then separated. Chips that pass functional testing are then packaged for sale as individual units.

The fabrication process comprises many steps, including deposition, masking, etching and other process steps. Defects are potentially and invariably introduced at each step of the process. Some types and quantity of defects are allowable and not fatal to the functionality of the final product. However, for process and quality control reasons, the defects are monitored.

Defects are introduced during deposition of desired materials such as silicon dioxide, silicon nitride, metal composites, polycrystalline silicon (polysilicon), and single crystal silicon. Additional defects are introduced during subsequent patterning steps such as masking and etching.

Electronic devices, chips, are formed upon "product" wafers subjected to the steps of a wafer fabrication process. "Control" wafers are processed independently of product wafers. The control wafers are used to measure total numbers of defects (defect count) introduced onto wafers during selected steps of the wafer fabrication process. For example, a masking step which forms features upon an exposed surface of a wafer typically involves depositing a layer of a desired material upon the exposed surface, applying a layer of photosensitive photoresist over the layer of the desired material, exposing a portion of the photoresist layer to light passed through a mask, removing the exposed portion (positive photoresist) or the unexposed portion (negative photoresist) of the photoresist layer (i.e., developing the photoresist layer), etching a portion of the layer of the desired material not covered by a remaining portion of the photoresist layer, and removing the remaining portion of the photoresist layer. The total number of defects introduced during the masking step may be determined by summing the number of defects introduced during each step involved in the masking step.

For the deposition step, the total number of defects upon an exposed surface of a control wafer is measured before subjecting the control wafer to the deposition step. Following the deposition step, the total number of defects present within and upon the deposited layer is measured. The total number of defects introduced during the deposition step is the total number of defects present within and upon the deposited layer following the deposition step minus the total number of defects present upon the exposed surface of the control wafer prior to the deposition step.

For the photoresist application step, the total number of defects upon an exposed surface of a control wafer is measured before processing the control wafer through the photoresist application apparatus. Due to peculiarities in the laser scanning measurement techniques, the photoresist layer is not applied to the exposed surface of the control wafer although the control wafer is otherwise processed in the photoresist application apparatus. Following the processing of the control wafer through the photoresist apparatus, the total number of defects present upon the exposed surface of the control wafer is measured. The total number of defects introduced during the photoresist application step is the total number of defects present upon the exposed surface of the control wafer following the processing of the control wafer through the photoresist application apparatus minus the total number of defects present upon the exposed surface of the control wafer prior to processing.

For the exposure step, the total number of defects upon an exposed surface of a control wafer is measured before subjecting the control wafer to the exposure step. Following the exposure step, the total number of defects present upon the exposed surface of the control wafer is measured. The total number of defects introduced during the exposure step is the total number of defects present upon the exposed surface of the control wafer following the exposure step minus the total number of defects present upon the exposed surface of the control wafer prior to the exposure step.

For the developing step, the total number of defects upon an exposed surface of a control wafer is measured before subjecting the control wafer to the developing step. Following the developing step, the total number of defects present upon the exposed surface of the control wafer is measured. The total number of defects introduced during the developing step is the total number of defects present upon the exposed surface of the control wafer following the developing step minus the total number of defects present upon the exposed surface of the control wafer prior to the developing step.

For the etching step, a control wafer is prepared by depositing a layer of the desired material upon an exposed surface of the wafer. The total number of defects upon and within the layer of the desired material is measured before subjecting the control wafer to the etching step. During the etching step, the layer of the desired material is substantially removed. Following the etching step, the total number of defects present upon the exposed surface of the control wafer is measured. The total number of defects introduced during the etching step is the total number of defects present upon the exposed surface of the control wafer following the etching step minus the total number of defects upon and within the layer of the desired material prior to the etching step.

For the resist removal step, the total number of defects upon an exposed surface of a control wafer is measured before subjecting the control wafer to the resist removal step. Following the resist removal step, the total number of defects present upon the exposed surface of the control wafer is measured. The total number of defects introduced during the resist removal step is the total number of defects present upon the exposed surface of the control wafer following the resist removal step minus the total number of defects present upon the exposed surface of the control wafer prior to the resist removal step.

As is readily apparent, defects introduced at earlier stages of the process have the potential to create additional defects down the line. When control wafer treatment differs from the product wafer treatment, uncertainties enter any tests conducted. It therefore is beneficial to conduct all testing on actual product wafers.

SUMMARY OF THE INVENTION

A method is provided for performing in-line process checks in an integrated circuit fabrication process. The process checks are performed on actual product wafers, rather than control wafers. According to the method, production lots of product wafers are subjected to in-line testing. Selected wafers representing each chamber of the fabrication apparatus are tested for defects. Using the actual product wafers allows the detection of the quantity, size, type, composition, and even the cause of the defects. When defects are found, the fabrication process and apparatus are adjusted to avoid producing additional lots with undesirable defects.

BRIEF DESCRIPTION OF THE DRAWING

The sole Figure is a flow chart of the method of the invention.

DETAILED DESCRIPTION OF THE INVENTION

Figure 1:
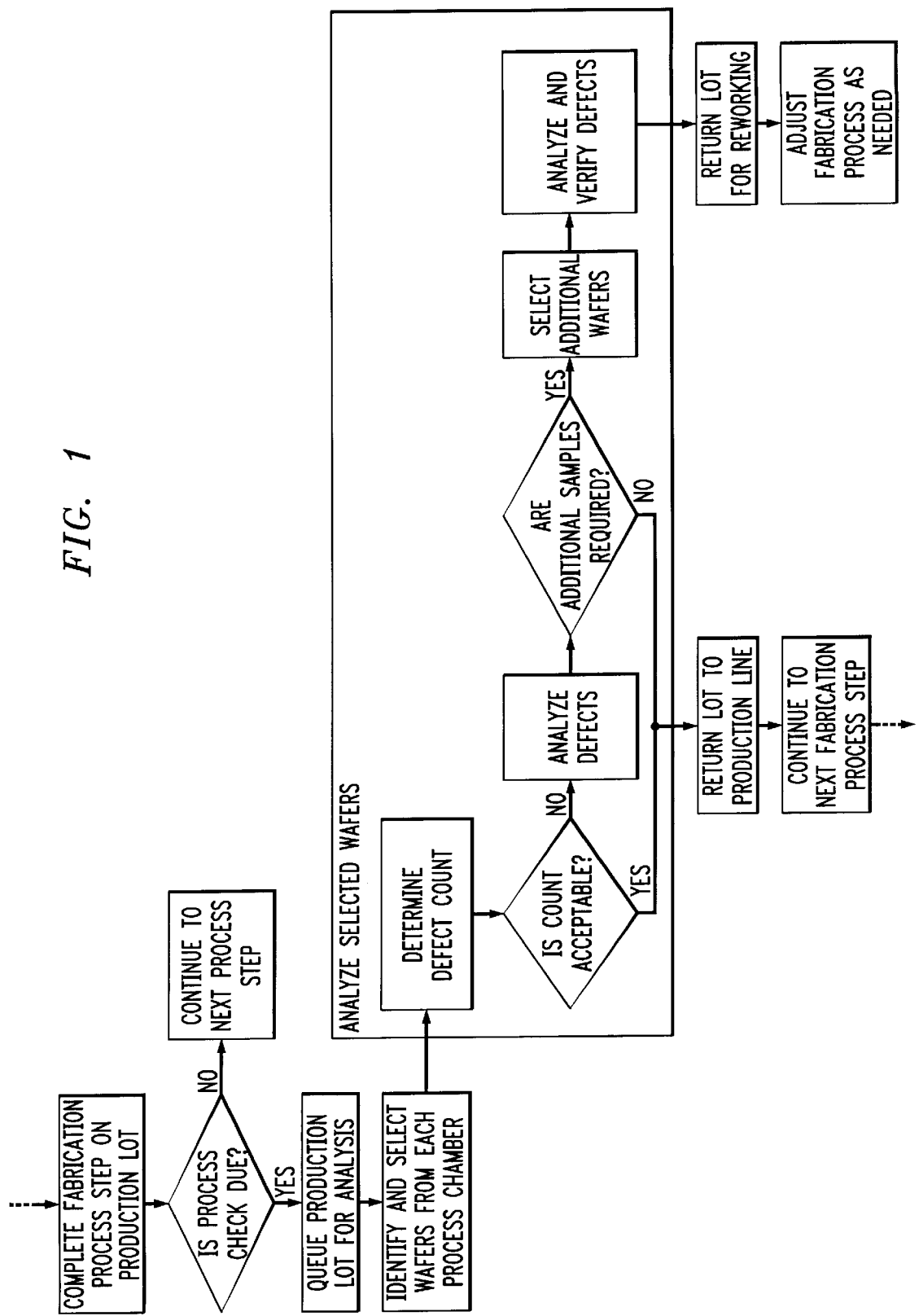

As described above, integrated circuits are formed through a complicated fabrication process. Each step of the process may introduce its own defects to the product wafer. Common defects include particulate matter such as remaining nitride, polymer, ball bats, and general particles. Some particulate matter is introduced through ambient air, process personnel, or through process equipment.

Many of these defects cannot be seen on control wafers because control wafers are not treated identically to the product wafers. One type of such defects are known as ball bats. Ball bats are molten aluminum drops, resulting from an arc, that condense on the wafer surface, taking on the shape of a ball and bat. Because ball bats are yield limiters, which reduce the amount of marketable product, it is important to detect their presence so that the fabrication process can be adjusted to avoid continued chamber arcing.

Because the control wafer is not treated precisely as the product wafer, it is not completely representative of the product wafer or the final chip product. As discussed above, the control wafer passes through the same apparatus, but does not necessarily receive all deposition or treatment materials (i.e. photoresist). Only the product wafer, itself, has the topography and other characteristics that are found in the final product. Accordingly, only the product wafer provides a true basis for analysis.

According to the invention, a product wafer is subjected to process checks during the fabrication process. This allows for nearly real time analysis of the fabrication process, if desired or necessary. A product wafer lot is processed normally to produce integrated circuit chips. During the process, a plurality of wafers are processed in a plurality of chambers. Each product wafer is mapped to and identified with an individual process chamber. The wafer-chamber mapping is recorded throughout the process in a machine history to facilitate the identification process. After selected fabrication steps, a product wafer lot is sent to an in-line inspection area for analysis. The first two wafers processed in each of the plurality of chambers are identified for inspection. Because each wafer represents a specific chamber in the machine history, chamber specific problems are identifiable.

Inspection is conducted in a special metrology area during a metrology step of the process. The inspection is carried out initially on an Advanced Inspection Tool (AIT) on each selected product wafer. If the product wafers pass initial inspection, i.e. contain less than a maximum number of defects, the lot is returned to the production line to continue along the line of the fabrication process.

If, on the other hand, the results are unsatisfactory, the selected wafers are analyzed further. Unlike a control wafer, a product wafer has the topography and patterning required to determine the size, type, and often the source of the defect by examination with a Scanning Electron Micrograph (SEM) and/or optical microscopes. A control wafer viewed under these instruments would not reveal many defects, especially those associated with topography and patterning which are not present on the control wafer. If further analysis of these defects is needed, compositional analysis of the defect can be performed by Energy Dispersion X-Ray (EDX). This analysis can be performed only on the product wafer since the control wafer lacks the topography and patterning which are required to see the defects.

Additionally, the product wafer reveals additional defects induced by the topography and patterning, themselves. Such defects include stringers, which are residues left at the bottom of the well formation that may short the circuits. The topography and patterning can also aid in the detection of photo mask defects.

Once the nature of the defects has been determined, further sampling and analysis may be required to verify that the defect is not an aberration, and is repeating throughout the process step. If, after repeated sampling and analysis, the defects are found to be real, then steps are taken to adjust the fabrication process to remove the source of the defect.

In this manner, the production line, various chambers, materials, and the overall process are monitored and adjusted. The adjustments can be made in near real time and are based on defects found on actual product wafers rather than control wafers. Use of the product wafer directly represents the defects that appear in the final product chips.

By introducing in-line process checks on actual product wafers, substantial cost savings may be achieved. Initially, the expense of making, keeping and storing an inventory of control wafers can be reduced, if not avoided altogether. Additionally, actual product wafers can be made in the time previously allotted for making control wafers, thus increasing overall production rate. When near real time sampling and analysis are used, the process may be adjusted to correct defects before a large number of lots are produced including the defects. This reduces the need for extensive reworking or scrapping of product lots.

Through repeated sampling and testing, the integrated circuit fabrication process can be maximized. Once the process is maximized, in-line process checks can be done less frequently, because the apparatus and process benefited from in-line checks during an initial start-up period. The in-line process check method described above can be implemented at any stage of the fabrication process.

Given the advantages of in-line process checks on actual product wafers, many process areas, including nitride etch, hard mask, poly and argon fillet etch can implement the product wafer process checks according to the invention.

What is claimed is:

1. In an integrated circuit fabrication process including a plurality of fabrication steps, a method for conducting in-line process checks comprises the steps of:

(a) completing a fabrication process step on a production lot of product wafers;

(b) determining that a process check is due;

(c) queuing said lot for in-line analysis;

(d) selecting a product wafer from said queued lot;

(e) analyzing said selected product wafer for defects; and (f) adjusting the fabrication process and apparatus, as needed, based on said analysis.

2. The method of claim 1, further comprising the steps of:
   (a) returning said production lot to the fabrication process when defects are acceptable, and proceeding to the next fabrication process step and skipping the next step; and
   (b) returning said production lot for reworking when defects are unacceptable.

3. The method of claim 1, wherein said analysis step (e) further comprises:
   (a) determining a defect count on said selected product wafer;
   (b) returning said selected product wafer and said selected lot to the next fabrication step if defect count is acceptable and skipping directly to step (f); and
   (c) analyzing each defect to determine its properties.

4. The method of claim 3, wherein said analysis step (e) further comprises:
   (a) selecting another product wafer for verifying said analysis;
   (b) determining defect count on said another product wafer; and
   (c) analyzing each defect to determine its properties.

5. In an integrated circuit fabrication process including a plurality of fabrication steps, a method for conducting in-line process checks comprises the steps of:
   (a) completing a fabrication process step on a production lot of product wafers;
   (b) determining that a process check is due;
   (c) queuing said lot for in-line analysis;
   (d) identifying a first and a second product wafer from each of a plurality of process chambers;
   (e) selecting each of said identified product wafers for analysis;
   (f) analyzing each of said selected product wafers for defects; and
   (g) adjusting the fabrication process and apparatus, as needed, based upon said analysis.

6. The method of claim 5, comprising the steps of:
   (a) returning said production lot to the fabrication process when defects are acceptable, and proceeding to the next fabrication process step and skipping the next step; and
   (b) returning said production lot for reworking when defects are unacceptable.

7. The method of claim 5, wherein said analysis step (f) further comprises:
   (a) determining a defect count on said selected product wafer;
   (b) returning said selected product wafer and said selected lot to the next fabrication step if defect count is acceptable and skipping directly to step (f); and
   (c) analyzing each defect to determine its properties.

8. The method of claim 7, wherein said analysis step (f) further comprises:
   (a) selecting another product wafer for verifying said analysis;
   (b) determining defect count on said another product wafer; and
   (c) analyzing each defect to determine its properties.

* * * * *